(12) United States Patent
Lee et al.

(10) Patent No.: US 12,191,417 B2
(45) Date of Patent: Jan. 7, 2025

(54) LIGHT EMITTING ELEMENT, MANUFACTURING METHOD FOR LIGHT EMITTING ELEMENT, AND DISPLAY DEVICE INCLUDING THE SAME

(71) Applicant: Samsung Display Co., LTD., Yongin-si (KR)

(72) Inventors: Chang Hee Lee, Yongin-si (KR); Dong Uk Kim, Yongin-si (KR); Se Hun Kim, Yongin-si (KR); Hyo Jin Ko, Yongin-si (KR); Dong Hoon Kwak, Yongin-si (KR); Young Il Kim, Yongin-si (KR); Ji Yoon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 627 days.

(21) Appl. No.: 17/320,925

(22) Filed: May 14, 2021

(65) Prior Publication Data
US 2022/0109083 A1 Apr. 7, 2022

(30) Foreign Application Priority Data
Oct. 6, 2020 (KR) .......................... 10-2020-0129012

(51) Int. Cl.
*H01L 33/20* (2010.01)
*H01L 27/15* (2006.01)
(Continued)

(52) U.S. Cl.
CPC ............ *H01L 33/20* (2013.01); *H01L 27/156* (2013.01); *H01L 33/005* (2013.01); *H01L 33/382* (2013.01)

(58) Field of Classification Search
CPC ...... H01L 33/20; H01L 27/156; H01L 33/005; H01L 33/382; H01L 25/0753;
(Continued)

(56) References Cited

U.S. PATENT DOCUMENTS 7,361,521 B2   4/2008  Oh et al.
8,330,173 B2  12/2012  Kim
(Continued)

FOREIGN PATENT DOCUMENTS

JP       4992311       8/2012
KR    10-0706951       4/2007
(Continued)

OTHER PUBLICATIONS

Extended European search report for European Patent Application or Patent No. 21200818.9 dated Mar. 4, 2022.

*Primary Examiner* — Su C Kim
(74) *Attorney, Agent, or Firm* — KILE PARK REED & HOUTTEMAN PLLC

(57) ABSTRACT

A light emitting element includes a first surface corresponding to an end of the light emitting element, a second surface corresponding to another end of the light emitting element, a first semiconductor layer adjacent to the first surface, the first semiconductor layer including a first type of semiconductor, a second semiconductor layer adjacent to the second surface, the second semiconductor layer including a second type of semiconductor different from the first type of semiconductor, and an active layer disposed between the first semiconductor layer and the second semiconductor layer. An area of the first surface is larger than an area of the second surface, and a distance between the first surface and the second surface is shorter than a length defined by the first surface.

16 Claims, 10 Drawing Sheets

(51) Int. Cl.
*H01L 33/00* (2010.01)
*H01L 33/38* (2010.01)

(58) Field of Classification Search
CPC ............. H01L 2933/0033; H01L 33/44; H01L 33/0093; H01L 2933/0008
See application file for complete search history.

(56) References Cited

U.S. PATENT DOCUMENTS

| | | | |
|---|---|---|---|
| 9,112,112 B2 | 8/2015 | Do et al. | |
| 10,193,042 B1* | 1/2019 | Tsai | H01L 25/0753 |
| 10,246,634 B2 | 4/2019 | Yang et al. | |
| 2012/0223345 A1* | 9/2012 | Tomoda | H01L 33/46 257/89 |
| 2015/0179873 A1 | 6/2015 | Wunderer et al. | |
| 2015/0179876 A1* | 6/2015 | Hu | H01L 33/20 257/13 |
| 2016/0181476 A1 | 6/2016 | Chang et al. | |
| 2017/0317228 A1 | 11/2017 | Sung | |
| 2017/0331008 A1* | 11/2017 | Wang | H01L 29/8613 |
| 2017/0373228 A1* | 12/2017 | Chang | H01L 33/44 |
| 2019/0115328 A1* | 4/2019 | Lee | H01L 33/00 |
| 2019/0288156 A1* | 9/2019 | Chaji | H01L 29/42312 |
| 2019/0378953 A1 | 12/2019 | Min et al. | |
| 2020/0075809 A1 | 3/2020 | Rajan et al. | |

FOREIGN PATENT DOCUMENTS

| | | |
|---|---|---|
| KR | 10-2009-0121743 | 11/2009 |
| KR | 10-2011-0042249 | 4/2011 |
| KR | 10-1244926 | 3/2013 |
| KR | 10-2014-0109377 | 9/2014 |
| KR | 10-1542504 | 8/2015 |
| KR | 10-1672781 | 11/2016 |
| KR | 10-2018-0105873 | 10/2018 |
| KR | 10-2019-0140545 | 12/2019 |
| WO | 2004/109764 | 12/2004 |
| WO | 2013/070321 | 5/2013 |

* cited by examiner

LIGHT EMITTING ELEMENT, MANUFACTURING METHOD FOR LIGHT EMITTING ELEMENT, AND DISPLAY DEVICE INCLUDING THE SAME

CROSS-REFERENCE TO RELATED APPLICATION(S)

This application claims priority to and benefits of Korean Patent Application No. 10-2020-0129012 under 35 U.S.C. § 119, filed in the Korean Intellectual Property Office on Oct. 6, 2020, the entire contents of which are incorporated herein by reference.

BACKGROUND

1. Technical Field

The disclosure relates to a light emitting element, a manufacturing method for a light emitting element, and a display device including the same.

2. Description of the Related Art

Recently, as interest in information display is increasing, research and development for display devices has become continuous.

SUMMARY

The disclosure may provide a light emitting element, a manufacturing method for a light emitting element, and a display device including the same in which light emitting efficiency may be improved, a shortage defect in a light emitting element may be prevented, and inkjet process efficiency may be improved.

Problems recognized are not limited to the problems described herein, and other technical problems that may not be mentioned will be clearly understood by those skilled in the art from the following description.

According to an embodiment of the disclosure, a light emitting element may comprise a first surface corresponding to an end of the light emitting element; a second surface corresponding to another end of the light emitting element; a first semiconductor layer adjacent to the first surface, the first semiconductor layer including a first type of semiconductor, a second semiconductor layer adjacent to the second surface, the second semiconductor layer including a second type of semiconductor different from the first type of semiconductor, and an active layer disposed between the first semiconductor layer and the second semiconductor layer. An area of the first surface may be larger than an area of the second surface, and a distance between the first surface and the second surface may be shorter than a length defined by the first surface.

According to an embodiment, the first surface and the second surface may each have a circular shape or an n-polygonal shape (n may be an integer of 3 or more).

According to an embodiment, a light emitting element may have at least one of a truncated cone shape and a prismoid shape.

According to an embodiment, the first surface and the second surface may each have a circular shape, and the length defined by the first surface may be a diameter of the first surface.

According to an embodiment, a distance between the first surface and the second surface may be about 0.9 times or less than the diameter of the first surface.

According to an embodiment, the first surface and the second surface may each have an n-polygonal shape (n may be an integer of 3 or more), and the length defined by the first surface may be a length of a longest side of the first surface.

According to an embodiment, the first surface and the second surface may each have an n-polygonal shape (n may be an integer of 3 or more), and the length L defined by the first surface may be defined by the following equation Equation: $L=\sqrt{x \times y}$, where L is the length defined by the first surface, x is a diameter of an inscribed circle with respect to the first surface, and y is a diameter of a circumscribed circle with respect to the first surface.

According to an embodiment, a volume of the light emitting element may be about 3 $\mu m^3$ or less.

According to an embodiment, a generating line and the first surface of the light emitting element may have an angle, and the angle may be less than about 60 degrees.

According to an embodiment, one of surfaces disposed on a side surface and the first surface of the light emitting element have an angle, and the angle may be less than about 60 degrees.

According to another embodiment of the disclosure, a method of manufacturing a light emitting element may include preparing a stacked substrate, forming a sacrificial layer on the stacked substrate, forming a first semiconductor layer including a first type of semiconductor on the sacrificial layer, forming an active layer on the first semiconductor layer, forming a second semiconductor layer including a second type of semiconductor on the active layer, and performing an etching process in a direction from the second semiconductor layer toward the first semiconductor layer to remove at least a part of each of the first semiconductor layer, the active layer, and the second semiconductor layer. The etching process may be performed such that an area of an etched region decreases as an etching depth increases.

According to an embodiment, in the performing of the etching process, a light emitting stacked pattern may be formed, in which the first semiconductor layer, the active layer, and the second semiconductor layer are sequentially stacked on each other.

The method may further include separating the light emitting stacked pattern from the stacked substrate and the sacrificial layer. After the separating of the light emitting stacked pattern, the light emitting element is formed to have a shape of a truncated cone or a prismoid.

According to an embodiment, the light emitting element may have a truncated cone shape of which a surface has a first diameter and another surface has a second diameter larger than the first diameter, and a distance between the surface and the another surface may be smaller than the second diameter.

According to an embodiment, the light emitting element may have an n-polygonal shape (n may be an integer of 3 or more) in which a surface has a first area, and another surface has an n-polygonal shape having a second area larger than the first area, and a distance between the surface and the another surface satisfies the following equation.

Equation: $h \leq \sqrt{x \times y}$, where h is the distance, x is a diameter of an inscribed circle with respect to the another surface, and y is a diameter of a circumscribed circle with respect to the other surface.

According to an embodiment, the etching process may include at least one of reactive ion etching (RIE), reactive ion beam etching (RIBE), and inductively coupled plasma reactive ion etching (ICP-RIE).

According to another embodiment of the disclosure, a display device may include a substrate, a light emitting element including a first surface corresponding to an end of the light emitting element, a second surface corresponding to another end of the light emitting element, a first semiconductor layer adjacent to the first surface, the first semiconductor layer including a first type of semiconductor, a second semiconductor layer adjacent to the second surface, the second semiconductor layer including a second type of semiconductor different from the first type of semiconductor, and an active layer disposed between the first semiconductor layer and the second semiconductor layer, a first electrode disposed on the substrate and electrically connected to the light emitting element through the second surface, and a second electrode disposed on the substrate and electrically connected to the light emitting element through the first surface. An area of the first surface may be larger than an area of the second surface, and a distance between the first surface and the second surface may be shorter than a length defined by the first surface, the first electrode may be disposed between the substrate and the second electrode, the first surface may physically contact at least a part of the second electrode, and the second surface includes an area smaller than an area of the first surface may physically contact with at least a part of the first electrode.

According to an embodiment, an area in which the first electrode and the second surface physically contact with each other may be smaller than an area in which the second electrode and the first surface physically contact with each other.

According to an embodiment, an electrical signal may flow between the first electrode and the second electrode in a first direction, and the first direction may be perpendicular to a main surface of the substrate.

According to an embodiment, a polarity of the first electrode may correspond to a polarity of the first type of the semiconductor, and a polarity of the second electrode corresponds to a polarity of the second type of semiconductor.

Solutions of the problems identified in this disclosure are not limited to the solutions described above, and solutions that are not mentioned will be able to clearly understand by those of ordinary skill in the art from the specification and the accompanying drawings.

According to an example of the disclosure, it may be possible to provide a light emitting element, a manufacturing method for a light emitting element, and a display device including the same in which light emitting efficiency may be improved, a shortage defect in a light emitting element may be prevented, and inkjet process efficiency may be improved.

Effects of the disclosure are not limited to the effects described above, and effects that are not mentioned will be clearly understood by those of ordinary skill in the art from the specification and the accompanying drawings.

DETAILED DESCRIPTION OF THE EMBODIMENTS

Figure 1:
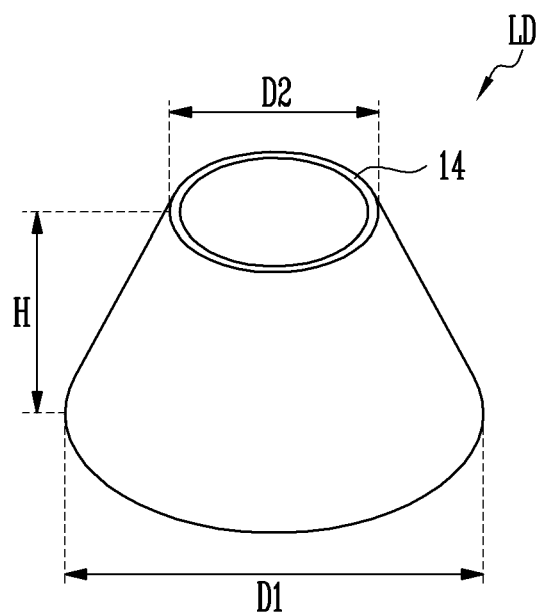
FIGS. 1 and 2 are a perspective view and a sectional view schematically illustrating a light emitting element according to an example.

Since the examples described in the specification are intended to clearly explain the idea of the disclosure to those of ordinary skill in the art to which the disclosure pertains, the disclosure is not limited by the examples described herein, and the scope of the disclosure should be construed as including modifications or variations that do not depart from ideas of the disclosure.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms, "a," "an," and "the" are intended to include the plural forms as well (and vice versa), unless the context clearly indicates otherwise.

The drawings attached to the specification are provided for easy explanation of the disclosure, and the shapes illustrated in the drawings may be exaggerated and displayed as needed to aid understanding of the disclosure. The disclosure should not be limited by the drawings.

In the specification, when it is determined that a detailed description of a known configuration or function related to the disclosure may obscure the subject matter, a detailed description thereof will be omitted as necessary.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The disclosure relates to a light emitting element, a manufacturing method for a light emitting element, and a display device including the same.

Hereinafter, the light emitting element, the manufacturing method for a light emitting element, and the display device including the same according to examples will be described with reference to FIGS. 1 to 17.

Figure 2:
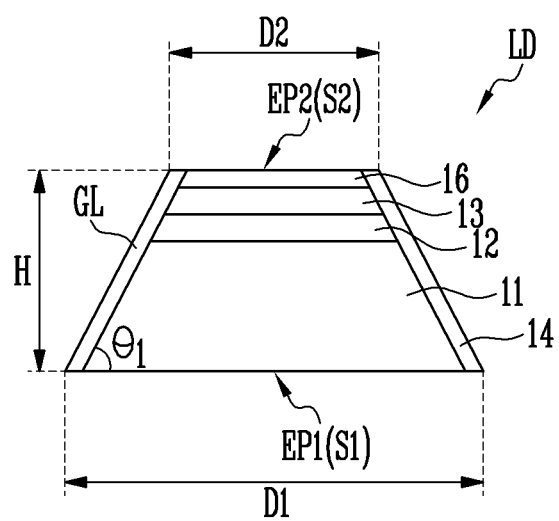
Figure 3:
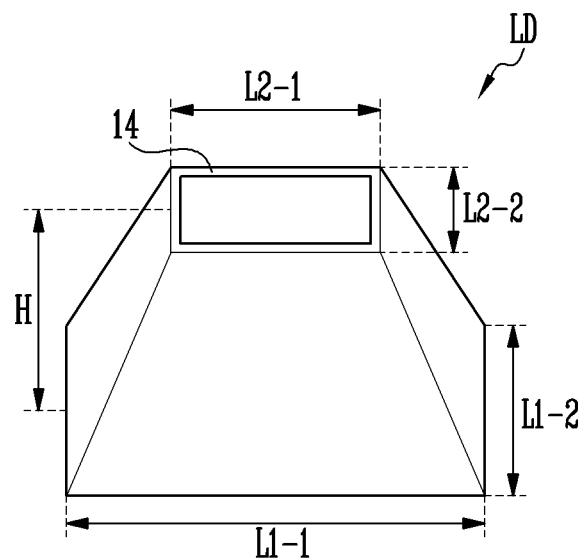
FIGS. 3 and 4 are a perspective view and a sectional view schematically illustrating a light emitting element according to another example.
Figure 4:
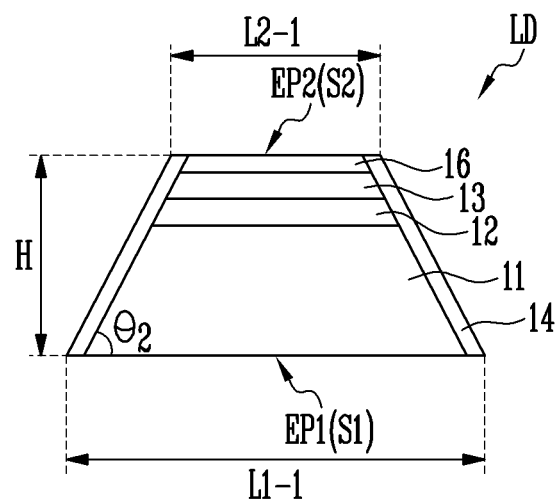

FIGS. 1 and 2 are a perspective view and a sectional view schematically illustrating a light emitting element according to an example. FIGS. 3 and 4 are a perspective view and a sectional view schematically illustrating a light emitting element according to another example.

Referring to FIGS. 1 to 4, a light emitting element LD may include a first semiconductor layer 11, a second semiconductor layer 13, an active layer 12 interposed between the first semiconductor layer 11 and the second semiconductor layer 13, and an electrode layer 16. The light emitting element LD may include the first semiconductor layer 11, the active layer 12, the second semiconductor layer 13, and the electrode layer 16 sequentially laminated in a direction of a height H.

Any one of the first semiconductor layer 11 and the second semiconductor layer 13 may be disposed at a position adjacent to a first end EP1 of the light emitting element LD, and another of the first semiconductor layer 11 and the second semiconductor layer 13 may be disposed at a position adjacent to a second end EP2 of the light emitting element LD.

For convenience of description, a region corresponding to an end of the light emitting element LD in which the first semiconductor layer 11 may be disposed may be defined as the first end EP1, and a region corresponding to another end of the light emitting element LD in which the second semiconductor layer 13 may be disposed may be defined as the second end EP2. For convenience of description, a surface corresponding to the first end EP1 may be defined as a first surface S1 of the light emitting element LD, and a surface corresponding to the second end EP2 may be defined as a second surface S2 of the light emitting element LD.

The light emitting element LD may have a size of a nanometer scale to a micrometer scale. However, the size of the light emitting element LD is not limited thereto, and the size of light emitting element LD may be changed in various ways according to design conditions of various devices (for example, a display device and the like) using a light emitting device, in which the light emitting element LD may be provided, as a light source.

The first semiconductor layer 11 may be disposed adjacent to the first surface S1 and not the second surface S2. The first semiconductor layer 11 may be a first conductive (or type) semiconductor layer. For example, the first semiconductor layer 11 may include an N-type semiconductor layer. As an example, the first semiconductor layer 11 may include an N-type semiconductor layer including a semiconductor material of at least one of InAlGaN, GaN, AlGaN, InGaN, AlN, and InN, and may be doped with a first conductive dopant such as Si, Ge, Sn, or a combination thereof. However, the material constituting the first semiconductor layer 11 is not limited thereto, and the first semiconductor layer 11 may be formed of various other materials.

The active layer 12 may be disposed on the first semiconductor layer 11 and may be formed in a single quantum well or a multi-quantum well structure. The position of the active layer 12 may be variously changed according to the type of the light emitting element LD.

A cladding layer (not illustrated) doped with a conductive dopant may be formed on an upper portion and/or a lower portion of the active layer 12. As an example, the cladding layer may be formed of an AlGaN layer or an InAlGaN layer. Depending on examples, a material such as AlGaN or InAlGaN may be used to form the active layer 12, and various other materials may constitute the active layer 12.

The second semiconductor layer 13 may be disposed on the active layer 12 and may include a different conductive (or type) semiconductor layer from that of the first semiconductor layer 11. The second semiconductor layer 13 may be adjacent to the second surface S2 and not the first surface S1. For example, the second semiconductor layer 13 may include a P-type semiconductor layer. For example, the second semiconductor layer 13 may include a P-type semiconductor layer including at least one semiconductor material of InAlGaN, GaN, AlGaN, InGaN, AlN, and InN, and may be doped with a second conductive dopant such as Mg. However, the material constituting the second semiconductor layer 13 is not limited thereto, and various other materials may constitute the second semiconductor layer 13.

Hereinafter, for convenience of description, an example in which the first semiconductor layer 11 includes the P-type semiconductor and the second semiconductor layer 13 includes the N-type semiconductor will be described.

In case that a voltage of a threshold voltage or higher is applied to two ends of the light emitting element LD, the electron-hole pairs may be coupled in the active layer 12 to provide light from the active layer 12, and the light emitting element LD may emit light. By controlling the light emission of the light emitting element LD by using such a principle, the light emitting element LD may be used as a light source of each of various light emitting devices including pixels of the display device.

The light emitting element LD may further include an insulating film 14 provided on the surface. The insulating film 14 may be formed on the surface of the light emitting element LD to surround at least an outer circumferential surface of the active layer 12. A region of each of the first semiconductor layer 11 and the second semiconductor layer 13, and a region of the electrode layer 16 may also be surrounded.

The insulating film 14 may include a transparent insulating material. According to an example, the insulating film 14 may be configured of a single layer including at least one insulating material of silicon oxide (SiOx), silicon nitride (SiNx), silicon oxynitride (SiOxNy), aluminum oxide (AlOx), and titanium oxide (TiOx), or a multiple-layer (for example, a double-layer configured of aluminum oxide (AlOx) and silicon oxide (SiOx)), but is not necessarily limited thereto. Depending on examples, the insulating film 14 may be omitted.

The insulating film 14 may prevent an electrical short circuit that may occur in case that the active layer 12 comes into contact with a conductive material other than the first semiconductor layer 11 and the second semiconductor layer 13. The insulating film 14 may minimize a surface defect of the light emitting element LD, thereby improving the life and efficiency of the light emitting element LD. In case that multiple light emitting elements LD are provided to be disposed adjacent to each other, the insulating film 14 may prevent a short circuit that may occur between the light emitting elements LD.

The electrode layer 16 may be formed on the second semiconductor layer 13. The electrode layer 16 may include metal or metal oxide. According to an example, the electrode layer 16 may include at least one of Cr, Ti, Al, Au, Ni, ITO, IZO, ITZO, oxides thereof, or an alloy thereof.

The first end EP1 and the second end EP2 of the light emitting element LD may have different polarities. At least one of the first end EP1 and the second end EP2 of the light emitting element LD may be exposed by the insulating film 14, and the first end EP1 and/or the second end EP2 of the light emitting element LD may be electrically connected to an external configuration.

A volume of the light emitting element LD may be about 3 µm³ or less. In other embodiments, the volume of the light emitting element LD may be about 2 µm³ or less. The light emitting element LD according to the example may be manufactured so as to have a volume of a certain value or less, and in case that the light emitting element LD is included in ink (see 'INK' in FIG. 17) to execute an ink jet process, the light emitting element LD may be provided by being stably dispersed in a solvent (see, 'SLV' in FIG. 17) of the ink INK.

In the light emitting element LD, the first surface S1 and the second surface S2 may each have a polygonal shape. An upper surface and a lower surface of the light emitting element LD according to an example may each have a circular shape or an elliptical shape. According to another example, the upper surface of the light emitting element LD may have an n-polygonal shape (n may be an integer of 3 or more), and the lower surface of the light emitting element LD may be an n-polygonal shape similar to the upper surface. The shape of the upper surface and the lower surface of the light emitting element LD may be a rectangle, a square, a regular triangle, a regular pentagon, or a regular octagon, but is not limited to the examples described above.

The light emitting element LD may have a shape, and an area of the upper surface and an area of the lower surface of the light emitting element LD may be different from each other. The area of the first surface S1 and the area of the second surface S2 of the light emitting element LD may be different from each other. A sectional area of the light emitting element LD may be different in the direction of the height H.

For example, referring to FIGS. 1 and 2, the first surface S1 and the second surface S2 of the light emitting element LD according to an example may each have a circular shape having different areas. Referring to FIGS. 3 and 4, the first surface S1 and the second surface S2 of the light emitting element LD according to another example may each have a rectangular shape having different areas.

The area of the second surface S2 may be smaller than the area of the first surface S1. For example, referring to FIGS. 1 and 2, a diameter of the second surface S2, which may be a second diameter D2, may be smaller than a diameter of the first surface S1, which may be a first diameter D1. Accordingly, the circular area of the second surface S2 may be smaller than that of the first surface S1.

According to another example, referring to FIGS. 3 and 4, an area of the first surface S1 may be a first rectangular area defined as a product of a 1-1 length L1-1 and a 1-2 length L1-2, an area of the second surface S2 of the light emitting element LD may be a second rectangular area defined as a product of a 2-1 length L2-1 and a 2-2 length L2-2, and the second rectangular area may be smaller than the first rectangular area.

Since the areas of the first and second surfaces S1 and S2 of the light emitting element LD may be different from each other, so that the light emitting element LD may have a truncated cone shape or a prismoid shape. In FIGS. 3 and 4, the shape of the light emitting element LD is illustrated based on a rectangular prismoid, but the disclosure is not limited thereto. The light emitting element LD may have various prismoid shapes such as a triangular prismoid, a pentagonal prismoid, a hexagonal prismoid, and an octagonal prismoid.

The height H of the light emitting element LD may be smaller than a length defined by the first surface S1 of the light emitting element LD. The height H of the light emitting element LD may be defined as a distance between the first surface S1 and the second surface S2. The height of the light emitting element LD may be about 1 µm to 2 µm.

For example, referring to FIGS. 1 and 2, in case that the light emitting element LD has the truncated cone shape, the height H of the light emitting element LD may have a value smaller than the first diameter D1. In other embodiments, the height H of the light emitting element LD may be about 0.9 times or less the first diameter D1.

In other embodiments, referring to FIGS. 3 and 4, in case that the upper surface and the lower surface of the light emitting element LD each have the prismoid shape that may be a polygonal shape, the height H of the light emitting element LD may be smaller than a length of one side of the first surface S1 of the light emitting element LD. For example, the height H of the light emitting element LD may be smaller than the 1-1 length L1-1 or the 1-2 length L1-2. In other embodiments, the height H of the light emitting element LD may be a length of the longest side of the first surface S1 or less. In other embodiments, the height H of the light emitting element LD may satisfy the following equation.

Equation: Height (H)≤$\sqrt{x \times y}$, (x may be defined as a diameter of an inscribed circle with respect to the first surface S1 of the light emitting element LD, and y may be defined as a diameter of a circumscribed circle with respect to the first surface S1 of the light emitting element LD).

A line (or surface) defined by a side surface of the light emitting element LD and the first surface S1 of the light emitting element LD may have a contained angle. The contained angle may be about 60 degrees or less. The contained angle may be about 45 degrees or less. In other embodiments, the contained angle may be about 30 degrees or less.

For example, referring to FIG. 2, a generating line GL and the first surface S1 of the light emitting element LD may have the contained angle of a first angle ($\theta_1$) therebetween.

The first angle ($\theta_1$) may be about 60 degrees or less. The first angle ($\theta_1$) may be 45 degrees or less, or about 30 degrees or less.

As another example, referring to FIG. 4, any one of the surfaces disposed on the side surface and the second surface S2 of the light emitting element LD may have the contained angle of a second angle ($\theta_2$) therebetween. The second angle ($\theta_2$) may be about 60 degrees or less. The second angle ($\theta_2$) may in an embodiment be about 45 degrees or less, or about 30 degrees or less.

Sample technical effects generated in relation to structural characteristics of the light emitting element LD will be described later with reference to FIG. 17.

A light emitting device including the light emitting element LD described above may be used in various types of devices that require a light source including a display device. For example, the light emitting element LD may be disposed in a pixel of a display panel, and the light emitting element LD may be used as a light source of each pixel. However, the field of application of the light emitting element LD is not limited to the examples described above. For example, the light emitting element LD may be used in other types of devices requiring a light source, such as a lighting device.

Hereinafter, a manufacturing method for a light emitting element according to an example will be described in detail with reference to FIGS. 5 to 14.

FIGS. 5 to 14 are schematic sectional views in each step of the manufacturing method for the light emitting element according to the example.

Figure 5:
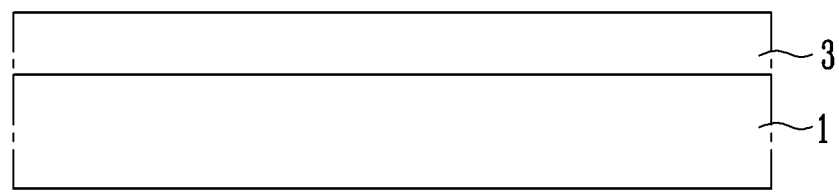
FIGS. 5 to 14 are schematic sectional views in each step of a manufacturing method for a light emitting element according to an example.

Referring to FIG. 5, a stacked substrate 1 may be disposed (e.g., prepared), and a sacrificial layer 3 may be disposed (e.g., formed) on the stacked substrate 1.

The stacked substrate 1 may be a base plate on which a target material may be laminated. The stacked substrate 1 may be a wafer for epitaxial growth for a certain material. According to an example, the stacked substrate 1 may be at least one of a sapphire substrate, a GaAs substrate, a Ga substrate, and an InP substrate, but is not limited thereto. For example, in case that a specific material satisfies a selectivity for manufacturing the light emitting element LD and epitaxial growth for a certain material may be smoothly generated, the specific material may be selected as a material of the stacked substrate 1. A surface of the stacked substrate 1 may be smooth. A shape of the stacked substrate 1 may be a polygonal shape including a rectangle or a circular shape, but is not limited thereto.

The sacrificial layer 3 may be disposed (e.g., provided) on the stacked substrate 1. The sacrificial layer 3 may physically separate the light emitting element LD from the stacked substrate 1 while manufacturing the light emitting element LD. The sacrificial layer 3 may include at least one of GaAs, AlAs, and AlGaAs. The sacrificial layer 3 may be formed by at least one of a metal organic chemical vapor-phase deposition (MOCVD), a molecular beam epitaxy (MBE), a vapor phase epitaxy (VPE), and a liquid phase epitaxy (LPE). However, the step of forming the sacrificial layer 3 on the stacked substrate 1 may be omitted depending on the selection of the manufacturing process of the light emitting element LD.

Figure 6:
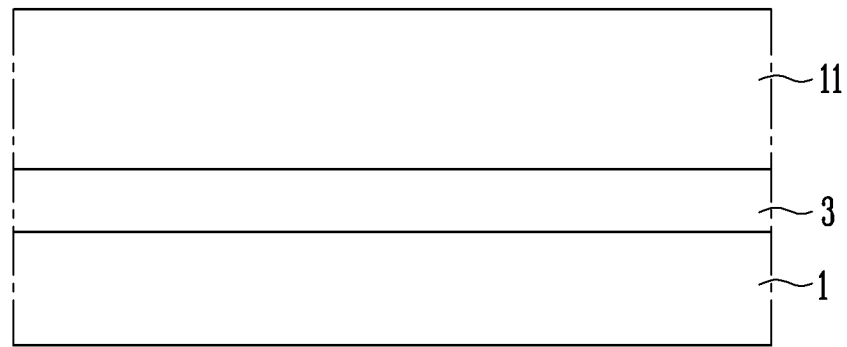

Referring to FIG. 6, the first semiconductor layer 11 may be formed on the sacrificial layer 3. Similar to the sacrificial layer 3, the first semiconductor layer 11 may be formed by epitaxial growth, and be formed by any one of the methods listed as the method for forming the sacrificial layer 3. Although not illustrated in the drawing, an additional semiconductor layer for improving crystallinity of the first semiconductor layer 11 may be provided between the sacrificial layer 3 and the first semiconductor layer 11.

Figure 7:
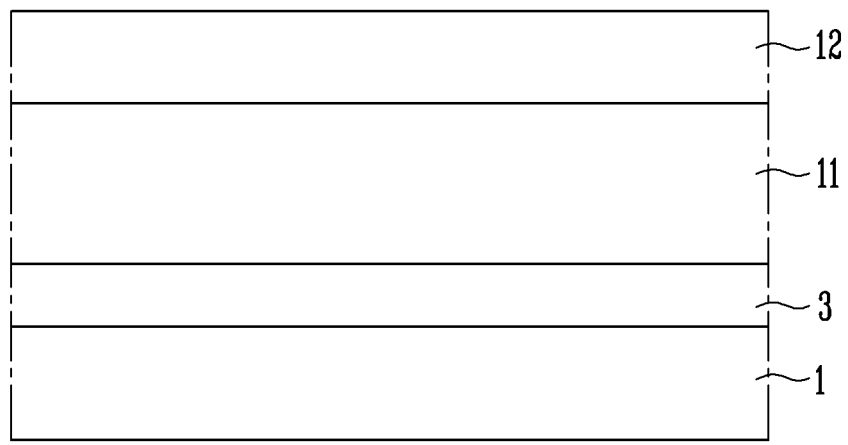

Referring to FIG. 7, the active layer 12 may be formed on the first semiconductor layer 11. The active layer 12 may emit light having a wavelength of about 400 nm to about 900 nm.

Figure 8:
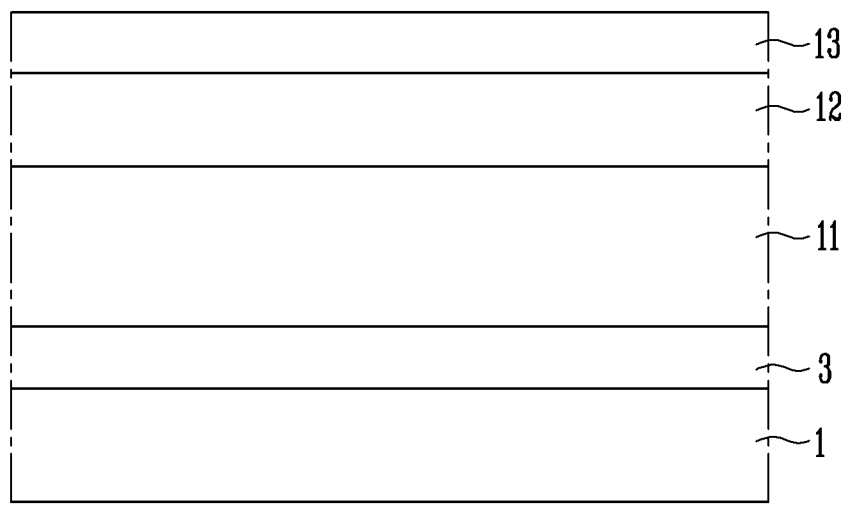

Referring to FIG. 8, the second semiconductor layer 13 may be formed on the active layer 12. The second semiconductor layer 13 may be formed of a semiconductor layer of a different type from that of the first semiconductor layer 11. As a result, the active layer 12 may be positioned between the first semiconductor layer 11 and the second semiconductor layer 13 having different polarities, and in case that an electrical signal of a voltage or higher is provided to both ends of the light emitting element LD, light may be emitted in the active layer 12.

Figure 9:
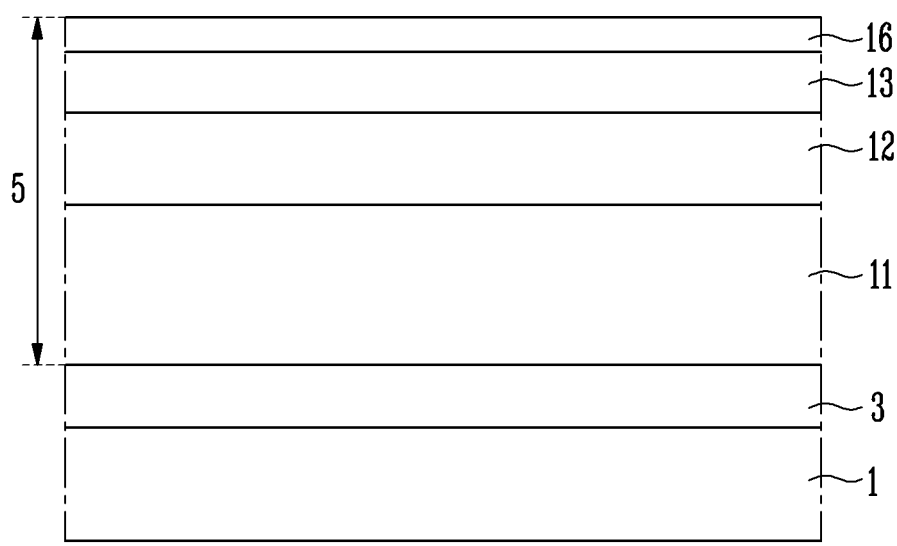

Referring to FIG. 9, the electrode layer 16 may be formed on the second semiconductor layer 13. The electrode layer 16 may include at least one of the materials listed above with reference to FIGS. 1 to 4. The electrode layer 16 may minimize a loss of light output from the active layer 12 and emitted to the outside of the light emitting element LD, and may include a transparent metal oxide such as indium tin oxide (ITO) to improve a current spreading effect to the second semiconductor layer 13.

As described above, the first semiconductor layer 11, the active layer 12, the second semiconductor layer 13, and the electrode layer 16 sequentially laminated on the stacked substrate 1 and the sacrificial layer 3 may be configured as a light emitting laminated structure 5.

Figure 10:
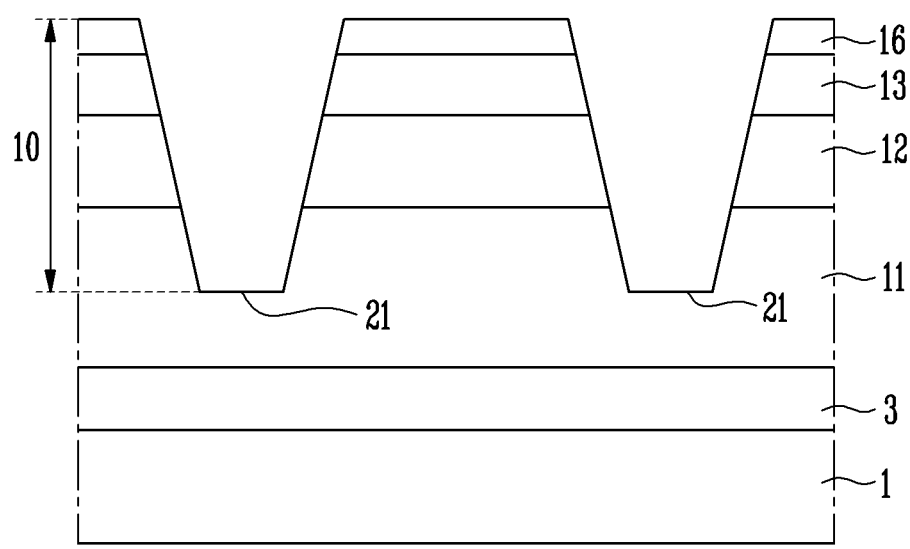

Referring to FIG. 10, a light emitting stacked pattern 10 may be formed by etching the light emitting laminated structure 5 in a lamination direction. The light emitting stacked pattern 10 may correspond to a range etched and removed in the lamination direction, and may mean a structure in which the first semiconductor layer 11, the active layer 12, the second semiconductor layer 13, and the electrode layer 16 may be sequentially formed. The lamination direction may mean a direction perpendicular to a main surface of the stacked substrate 1.

In order to form the light emitting stacked pattern 10, a mask (not illustrated) may be disposed on a surface (e.g., an entire surface) of the light emitting laminated structure 5, and an etching process may be performed to execute patterning at nanoscale or microscale intervals. In order to perform the etching process for the light emitting laminated structure 5, an etching mask pattern may be formed in which at least one of a circle, an ellipse, or an n-polygonal shape (n may be an integer of 3 or more) may be periodically disposed when viewed from a plane. A diameter of each circle of the formed circular pattern may be about 0.5 μm to about 2.0 μm. In other embodiments, a length of each side of each shape of the formed n-polygonal pattern may be about 0.5 μm to about 2.5 μm. The light emitting laminated structure 5 may be etched in the lamination direction by using an etching mask pattern formed thereafter, and in case that the etching process is performed, the light emitting stacked pattern 10 may be provided. An etched and removed depth may be about 1 μm to about 2 μm, and as a result, a height of the light emitting stacked pattern 10 may be about 1 μm to about 2 μm. In case that the etching process is performed, at least a part of the light emitting laminated structure 5 may be removed to provide a groove region 21, and at least a part of the first semiconductor layer 11 may be exposed from the groove region 21 to the outside.

As described above with reference to FIGS. 1 to 4, in the light emitting element LD according to an example, areas of the upper and lower surfaces may be different from each other. To this end, with respect to the light emitting laminated structure 5 in which the etching process may be performed, a process may be performed such that an area of the etched region decreases as the etching depth increases. For example, the etching process may be performed based on an etching mask pattern having a periodic pattern, and an etched surface may be tilted as the etched depth increases. As a result, the light emitting stacked pattern 10 may have a wider sectional area as it may be adjacent to the stacked substrate 1. For example, a sectional area of the first semiconductor layer 11 in the light emitting stacked pattern 10 with respect to a surface parallel to a main surface of the stacked substrate 1 may be larger than the sectional area of the second semiconductor layer 13 in the light emitting stacked pattern 10 with respect to a surface parallel to the main surface of the stacked substrate 1.

A dry etching method may be applied to the etching process for forming the light emitting stacked pattern 10. According to an example, the dry etching method may be at least one of reactive ion etching (RIE), reactive ion beam etching (RIBE), and inductively coupled plasma reactive ion etching (ICP-RIE), but is not limited thereto. Unlike a wet etching method, the dry etching method may make it easier to implement one-way etching, and thus may be suitable for forming the light emitting stacked pattern 10.

After the etching process for forming the light emitting stacked pattern 10, a residue (not illustrated) remaining on the light emitting stacked pattern 10 may be removed by a removal method. The residue may be an etching mask, an insulating material, or the like used during the mask process.

Depending on examples, after the etching process for forming the light emitting stacked pattern 10, a process of removing a damaged surface of the light emitting stacked pattern 10 may be performed. For example, a wet etching process may be performed to remove at least a part of the damaged surface of the light emitting stacked pattern 10. The wet etching process may be performed for about 5 to about 20 minutes based on a KOH solution. Impurities formed on the surface of the light emitting stacked pattern 10 may be removed by performing the wet etching process on the damaged surface of the light emitting stacked pattern 10.

Figure 11:
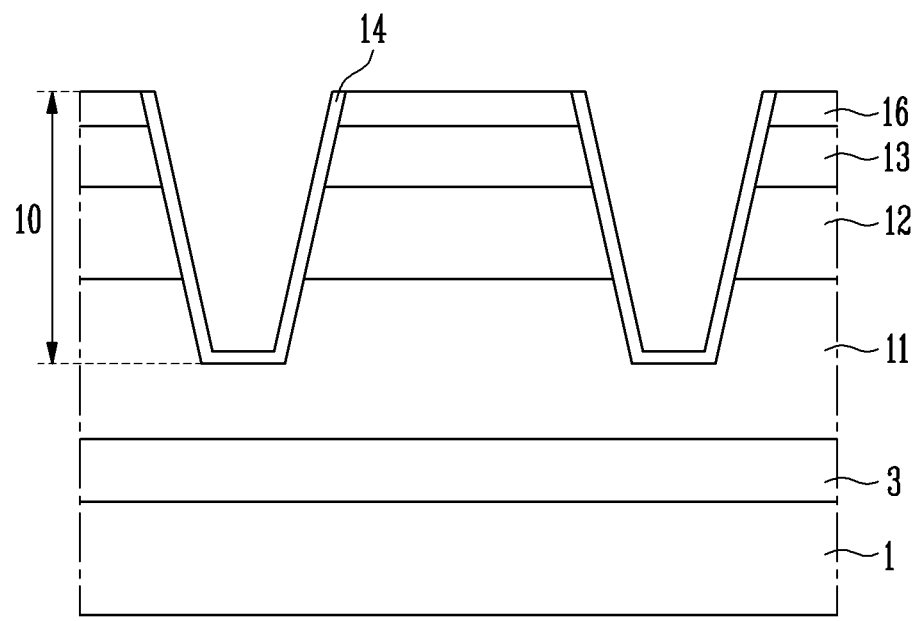

Referring to FIG. 11, an insulating film 14 may be formed on the first semiconductor layer 11, the active layer 12, the second semiconductor layer 13, and the electrode layer 16 exposed to the outside. The insulating film 14 may overlap the first semiconductor layer 11, the active layer 12, the second semiconductor layer 13, and the electrode layer 16, so that the first semiconductor layer 11, the active layer 12, and the second semiconductor layer 13, and the electrode layer 16 may not be exposed to the outside. FIG. 11 illustrates that the insulating film 14 is not formed on other surfaces of the electrode layer 16, which may not be in contact with the second semiconductor layer 13, but is not limited thereto. For example, after the insulating film 14 may be formed on other surfaces of the electrode layer 16, a separate process may be performed to remove it.

The insulating film 14 may be provided by coating an insulating material on the light emitting stacked pattern 10, but is not limited thereto. According to an example, the insulating film 14 may be formed by using at least one of an atomic layer deposition (ALD) method, a sol-gel process, and a chemical vapor deposition method (for example, plasma enhanced chemical vapor deposition (PECVD)). A thickness of the insulating film 14 may be about 10 nm to about 200 nm. In other embodiments, the thickness of the insulating film 14 may be about 30 nm to about 150 nm.

Although not illustrated in the drawing, an insulating layer may be further provided on the insulating film 14. According to an example, the insulating layer may include at least one of materials listed with reference to the insulating film 14. Like the insulating film 14, the insulating layer may be formed by the atomic layer deposition method, the sol-gel process, the chemical vapor deposition method, or a combination thereof. A thickness of the insulating layer may be about 10 nm to about 200 nm. In other embodiments, the thickness of the insulating layer may be about 30 nm to about 150 nm.

Figure 12:
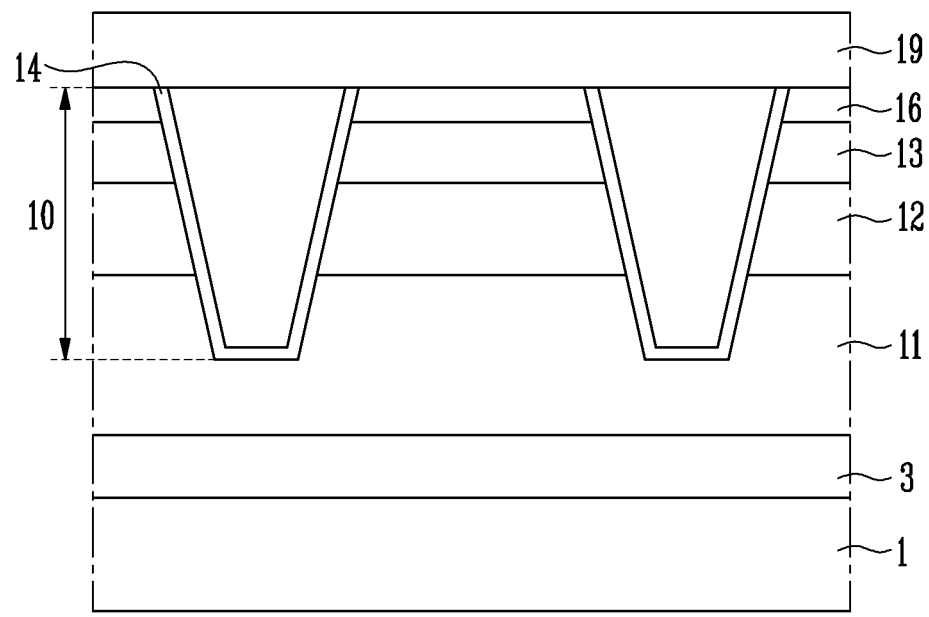

Referring to FIG. 12, a bonding layer 19 may be disposed (e.g., connected) on the light emitting stacked pattern 10. Although not illustrated in the drawings, a first metal may be coated on the light emitting stacked pattern 10 and a second metal may be coated on one surface of the bonding layer 19 to be connected to the light emitting stacked pattern 10. Coupling between the first metal and the second metal may be formed under certain temperature and pressure conditions, so that the bonding layer 19 and the light emitting stacked pattern 10 may be coupled. According to an example, the process of coupling the first metal and the second metal may be performed under a temperature condition of about 300° C. to about 400° C. and a pressure condition of about 1 kgf/cm$^2$ to about 5 kgf/cm$^2$. The first metal may be gold (Au) or tin (Sn), but is not limited thereto, and may be a single metal or a metal material in which multiple metals may be alternately disposed. For example, the first metal may be a metallic material in which gold (An), tin (Sn), and gold (Au) may be alternately disposed. A layer related to An of the first metal may have a thickness of about 500 nm, and a layer related to Sn of the first metal may have a thickness of about 1000 nm. The second metal may include a material having excellent thermal conductivity. For example, the second metal may include at least one of molybdenum (Mo), Cu-Graphite, and aluminum nitride ceramics (AlN).

Figure 13:
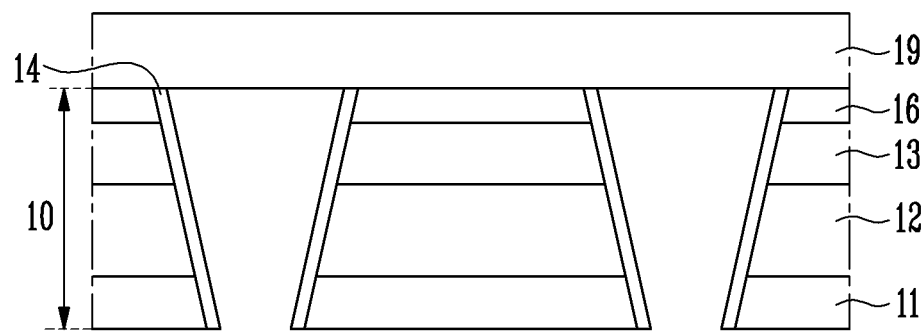
Figure 13:
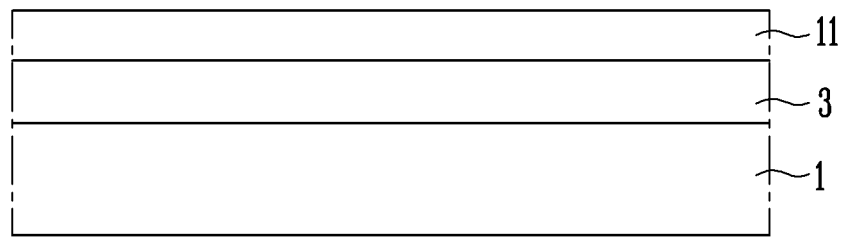

Referring to FIG. 13, the light emitting stacked pattern 10 may be separated from the stacked substrate 1 and the sacrificial layer 3. According to an example, the light emitting stacked pattern 10 may be separated by a laser lift-off (LLO) method or a chemical lift-off (CLO) method. A process of physically separating may be performed on the first semiconductor layer 11 disposed (e.g., positioned) between the light emitting stacked pattern 10 and the sacrificial layer 3. If the light emitting stacked pattern 10 may be separated, at least a part of the first semiconductor layer 11 which is not included in the light emitting stacked pattern 10 may still remain on the sacrificial layer 3.

Figure 14:
Figure 14:
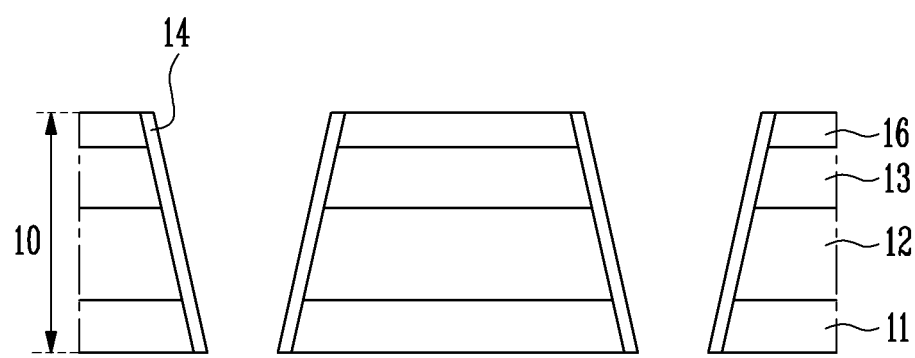

Referring to FIG. 14, the bonding layer 19 may be removed. The bonding layer 19 may be removed to provide the light emitting stacked pattern 10 having a shape. The separated light emitting stacked pattern 10 may be in a state where a surface of the electrode layer 16, the insulating film 14, and a surface of the first semiconductor layer 11 may be exposed to the outside. Thereafter, a process of removing impurities on the surface of the light emitting stacked pattern 10 exposed to the outside may be performed. According to an example, after performing the dry etching process on the first semiconductor layer 11 of the light emitting stacked pattern 10, a O$_2$ plasma treatment process may be performed on the surface of the first semiconductor layer 11 exposed to the outside, and thereby impurities existing on the surface of the first semiconductor layer 11 may be removed. In other embodiments, after performing the dry etching process on the first semiconductor layer 11 of the light emitting stacked pattern 10, at least a part of the first semiconductor layer 11 may be removed through a wet etching process, and thereby the concentration of impurities positioned on the first semiconductor layer 11 may be reduced. A KOH or NaOH solution may be applied as part of the wet etching process.

After the light emitting stacked pattern 10 may be separated from the stacked substrate 1 and the sacrificial layer 3, and the bonding layer 19 may be removed, the light emitting element LD described above with reference to FIGS. 1 to 4 may be provided.

Thereafter, the light emitting element LD provided as the light emitting stacked pattern 10 may be dispersed in solvent SLV, so that ink INK including the light emitting element LD and the solvent SLV may be manufactured.

Hereinafter, a display device to which the light emitting element LD according to the example may be applied will be described with reference to FIGS. 15 and 16.

Figure 15:
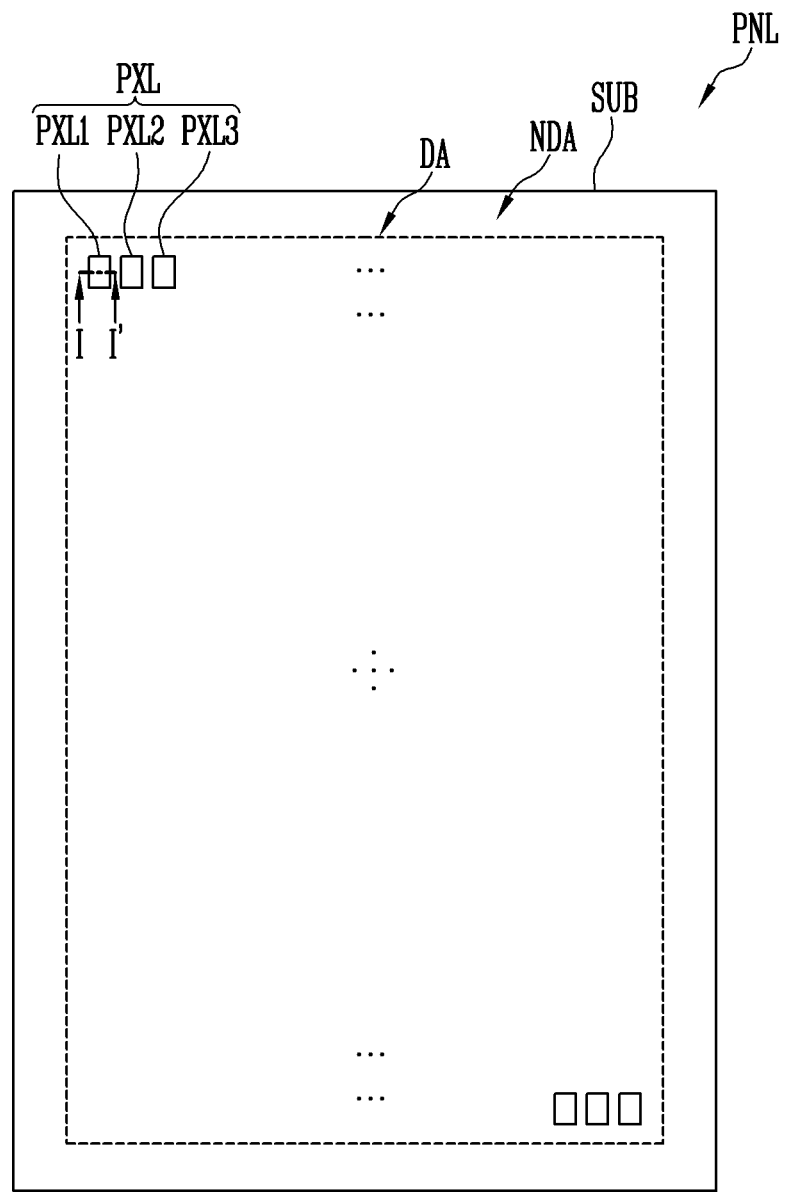
FIG. 15 is a plan view schematically illustrating a display device including the light emitting element according to the example.
Figure 15:
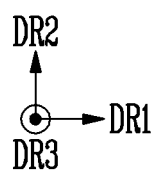

FIG. 15 is a plan view illustrating the display device including the light emitting element according to an example.

In FIG. 15, as an example of an electronic device that may use the light emitting element LD as a light source, a display device, particularly a display panel PNL provided in the display device, is illustrated. In FIG. 15, a structure of the display panel PNL is briefly illustrated focusing on a display region DA. However, depending on examples, at least one driving circuit portion (for example, at least one of a scan driver and a data driver), wires, and/or pads, which are not illustrated, may also be disposed in the display panel PNL.

Referring to FIG. 15, the display panel PNL may include a substrate SUB and a pixel PXL disposed on the substrate SUB. Multiple pixels PXL may be provided on the substrate SUB.

The substrate SUB may constitute a base member of the display panel PNL and may be a rigid or flexible substrate or film.

The display panel PNL and the substrate SUB for forming the same may include a display region DA for displaying an image and a non-display region NDA excluding the display region DA.

The pixel PXL may be disposed in the display region DA. The pixel PXL may include the light emitting element LD. Various wires, pads, and/or embedded circuit portions connected to the pixel PXL of the display region DA may be disposed in the non-display region NDA. The pixels PXL may be regularly disposed according to a stripe or PenTile® disposition structure, or the like. However, the disposition structure of the pixels PXL is not limited thereto, and the pixels PXL may be disposed in the display region DA in various structures and/or manners.

Depending on examples, two or more types of pixels PXL emitting light of different colors may be disposed in the display region DA. As an example, the pixel PXL may include a first pixel PXL1 that emits light of a first color, a second pixel PXL2 that emits light of a second color, and a third pixel PXL3 that emits light of a third color. At least one of the first to third pixels PXL1, PXL2, and PXL3 disposed to be adjacent to each other may constitute a pixel unit capable of emitting light of various colors. For example, the first to third pixels PXL1, PXL2, and PXL3 may be subpixels each emitting light of a certain color. Depending on examples, the first pixel PXL1 may be a red pixel emitting red light, the second pixel PXL2 may be a green pixel emitting green light, and the third pixel PXL3 may be a blue pixel emitting blue light, but examples are not limited thereto.

In one example, the first pixel PXL1, the second pixel PXL2, and the third pixel PXL3 each use the light emitting element of the first color, the light emitting element of the second color, and the light emitting element of the third color as light sources, and thereby it may be possible to emit light of the first color, the second color, and the third color, respectively. In another example, the first pixel PXL1, the second pixel PXL2, and the third pixel PXL3 may be provided with light emitting elements that emit light of the same color, and include color conversion layers and/or color filters of colors different from each other disposed on respective light emitting elements, and thereby light of the first color, the second color, and the third color may be emitted. However, the color, type and/or number of pixels PXL constituting each pixel unit are not particularly limited. For example, the color of the light emitted by each pixel PXL may be variously changed.

The pixel PXL may include at least one light source driven by a control signal (for example, a scanning signal and a data signal) and/or a power source (for example, a first power source and a second power source). In one example, each pixel PXL may be configured of an active pixel. However, a type, a structure, and/or a driving method of the pixels PXL applicable to the display device are not particularly limited. For example, each pixel PXL may be configured of a pixel of a passive or active light emitting display device having various structures and/or driving methods.

Figure 16:
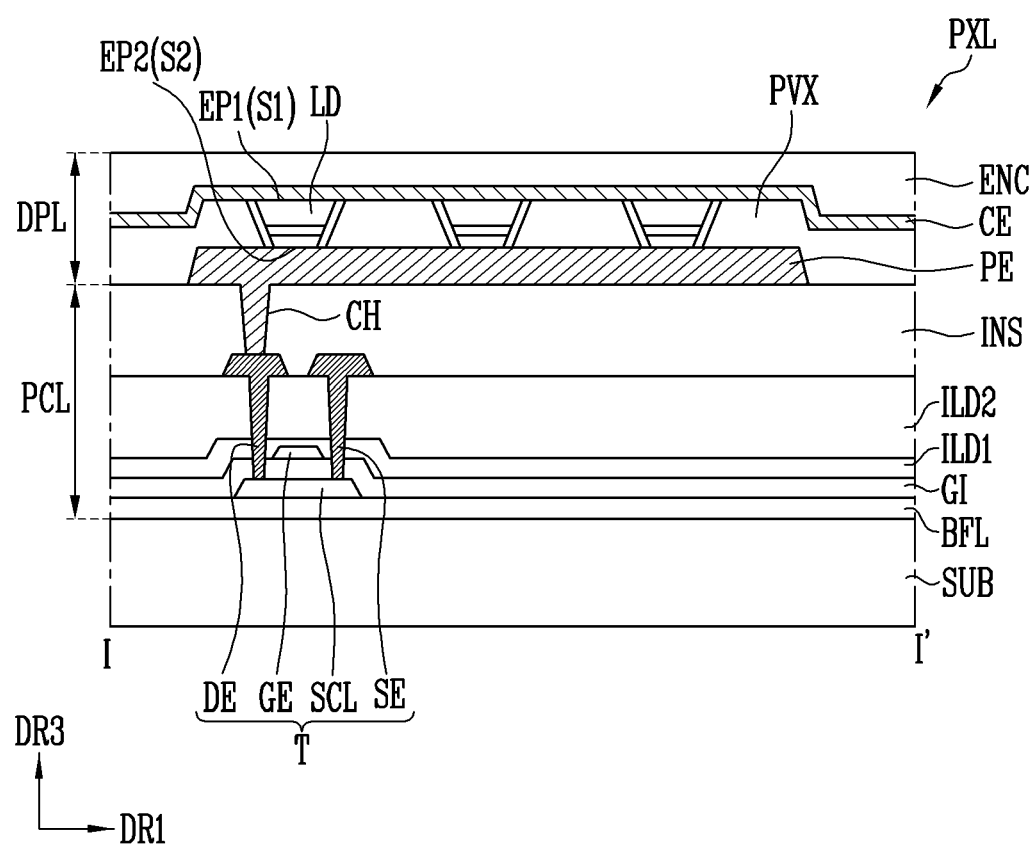
FIG. 16 is a schematic sectional view taken along line I-I' of FIG. 15.

FIG. 16 is a sectional view taken along line I-I' of FIG. 15. FIG. 16 schematically illustrates a structure of the pixel PXL.

Referring to FIG. 16, the pixel PXL may include the substrate SUB, a pixel circuit portion PCL, and a display element portion DPL.

The substrate SUB may be a rigid or flexible substrate. According to an example, the substrate SUB may include a rigid material or a flexible material. According to an example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the substrate SUB applied in an example of the disclosure is not limited to a specific example.

The pixel circuit portion PCL may be positioned on the substrate SUB. The pixel circuit portion PCL may include a buffer film BFL, a transistor T, a gate insulating film GI, a first interlayer insulating film ILD1, a second interlayer insulating film ILD2, a contact hole CH, and an insulating layer INS.

The buffer film BFL may be positioned on the substrate SUB. The buffer film BFL may prevent diffusion of impurities from the outside. The buffer film BFL may include at least one of metal oxides such as silicon nitride (SiNx), silicon oxide (SiOx), silicon oxynitride (SiOxNy), and aluminum oxide (AlOx).

The transistor T may be a thin film transistor. According to an example, the transistor T may be a driving transistor among thin film transistors. The transistor T may include a semiconductor layer SCL, a gate electrode GE, a source electrode SE, and a drain electrode DE.

The semiconductor layer SCL may be positioned on the buffer film BFL. The semiconductor layer SCL may include at least one of polysilicon, amorphous silicon, and oxide semiconductor.

The semiconductor layer SCL may include a first contact region being in contact with the source electrode SE and a second contact region being in contact with the drain electrode DE.

The first contact region and the second contact region may be a semiconductor pattern doped with impurities. A region between the first contact region and the second contact region may be a channel region. The channel region may be an intrinsic semiconductor pattern that may be not doped with impurities.

The gate insulating film GI may be provided on the semiconductor layer SCL. The gate insulating film GI may include an inorganic material. According to an example, the gate insulating film GI may include at least one of silicon nitride (SiNx), silicon oxide (SiOx), silicon oxynitride (SiOxNy), and aluminum oxide (AlOx). Depending on examples, the gate insulating film GI may include an organic material.

The gate electrode GE may be positioned on the gate insulating film GI. The position of the gate electrode GE may correspond to the position of the channel region of the semiconductor layer SCL. For example, the gate electrode GE may be disposed on the channel region of the semiconductor layer SCL with the gate insulating film GI interposed therebetween.

The first interlayer insulating film ILD1 may be positioned on the gate electrode GE. Like the gate insulating film GI, the first interlayer insulating film ILD1 may include at least one of silicon nitride (SiNx), silicon oxide (SiOx), silicon oxynitride (SiOxNy), and aluminum oxide (AlOx).

The source electrode SE and the drain electrode DE may be positioned on the second interlayer insulating film ILD2. The source electrode SE may penetrate the gate insulating film GI and the first interlayer insulating film ILD1 to be in contact with the first contact region of the semiconductor layer SCL, and the drain electrode DE may penetrate the gate insulating film GI and the first interlayer insulating film ILD1 to be in contact with the second contact region of the semiconductor layer SCL. The drain electrode DE may be electrically connected to the contact hole CH.

The second interlayer insulating film ILD2 may be positioned on the first interlayer insulating film ILD1. Like the first interlayer insulating film ILD1 and the gate insulating film GI, the second interlayer insulating film ILD2 may include an inorganic material. As the inorganic material, materials discussed as constituent materials of the first interlayer insulating film ILD1 and the gate insulating film GI, for example, at least one of silicon nitride (SiNx), silicon oxide (SiOx), silicon oxynitride (SiOxNy), and aluminum oxides (AlOx) may be included. Depending on examples, the second interlayer insulating film ILD2 may include an organic material.

The insulating layer INS may be provided in a form including an organic insulating film, an inorganic insulating film, or the organic insulating film disposed on the inorganic insulating film.

The insulating layer INS may include the contact hole CH electrically connected to a region of the drain electrode DE.

The display element portion DPL may be positioned on the pixel circuit portion PCL. The display element portion DPL may include a pixel electrode PE, the light emitting element LD, a connection electrode CE, a protective layer PVX, and an encapsulation layer ENC.

The pixel electrode PE may be disposed on the insulating layer INS. The pixel electrode PE may be an anode electrode. The pixel electrode PE may include at least a conductive material. According to an example, the pixel electrode PE may include copper (Cu), gold (Au), silver (Ag), magnesium (Mg), aluminum (Al), platinum (Pt), lead (Pb), nickel (Ni), Neodymium (Nd), iridium (Ir), chromium (Cr), lithium (Li), calcium (Ca) or a mixture thereof, indium tin oxide (ITO), indium zinc oxide (IZO), zinc oxide (ZnO), and indium oxide (In2O3), or a mixture thereof, but is not limited thereto.

At least a part of the connection electrode CE may be positioned on the protective layer PVX, and at least another part of the connection electrode CE may be disposed to be electrically connected to one end of the light emitting element LD. The connection electrode CE may be provided in a form of a plate on the display region DA but is not limited thereto. The connection electrode CE may include a transparent conductive raw material (or material) such as a transparent conductive oxide which may be at least one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO). In other embodiments, depending on examples, the connection electrode CE may include a translucent conductive raw material (or material) such as magnesium (Mg), silver (Ag), or an alloy of magnesium (Mg) and silver (Ag).

An electrical signal flowing in a third direction DR3 may be acquired between the pixel electrode PE and the connection electrode CE. In case that the electrical signal may be acquired, the light emitting element LD may output light. For example, an electrical signal may flow through the light emitting element LD in a direction from the first end EP1 to the second end EP2 or from the second end EP2 to the first end EP1, and the flowing direction of the electrical signal may be perpendicular to the main surface of the substrate SUB.

The polarity of the pixel electrode PE and the polarity of the connection electrode CE may be different from each other. For example, in case that the pixel electrode PE is the cathode electrode, the connection electrode CE may be the anode electrode, and in case that the pixel electrode PE is the anode electrode, the connection electrode CE may be the cathode electrode. Hereinafter, description will be made in which the pixel electrode PE may be the anode electrode and the connection electrode CE may be the cathode electrode.

The pixel electrode PE and the connection electrode CE may be disposed to be separated from each other. The pixel electrode PE may be electrically connected to the contact hole CH to provide an electric signal provided from the transistor T to the light emitting element LD.

The light emitting element LD may emit light in case that an electrical signal is provided. The light emitting element LD may output light in the third direction DR3. The light emitting element LD may be disposed on the pixel electrode PE. The light emitting element LD may be disposed such that the second end EP2 of the light emitting element LD faces the pixel electrode PE. The light emitting element LD may be disposed such that the first end EP1 of the light emitting element LD faces the connection electrode CE. The second end EP2 of the light emitting element LD may be electrically connected to the pixel electrode PE, and the first end EP1 of the light emitting element LD may be electrically connected to the connection electrode CE. For example, the second semiconductor layer 13 of the light emitting element LD may be electrically connected to the pixel electrode PE, and the first semiconductor layer 11 of the light emitting element LD may be electrically connected to the connection electrode CE.

At least a part of the second surface S2 of the light emitting element LD may be physically in contact with the pixel electrode PE. At least a part of the first surface S1 of the light emitting element LD may be physically in contact with the connection electrode CE.

An area of the light emitting element LD being in contact with the pixel electrode PE may be larger than an area thereof being in contact with the connection electrode CE. For example, the second surface S2 of the light emitting element LD may be connected to the pixel electrode PE to form a contact area, and the first surface S1 of the light emitting element LD may be connected to the connection electrode CE to form a contact region which may be at least larger than the contact region.

The protective layer PVX may be disposed to be adjacent to (e.g., surround) the light emitting elements LD. The protective layer PVX may remove a step due to the light emitting element LD or the like. The protective layer PVX may include an organic insulating material such as polyacrylates resin, epoxy resin, phenolic resin, polyamides resin, polyimides resin, unsaturated polyesters resin, polyphenylenethers resin, polyphenylenesulfides resin, benzocyclobutene (BCB), or a combination thereof but is not limited thereto.

The encapsulation layer ENC may be positioned on the connection electrode CE. The encapsulation layer ENC may be positioned outside the display element portion DPL and may flatten individual configurations. The encapsulation layer ENC may include an organic material or an inorganic material but is not limited to a specific material.

Figure 17:
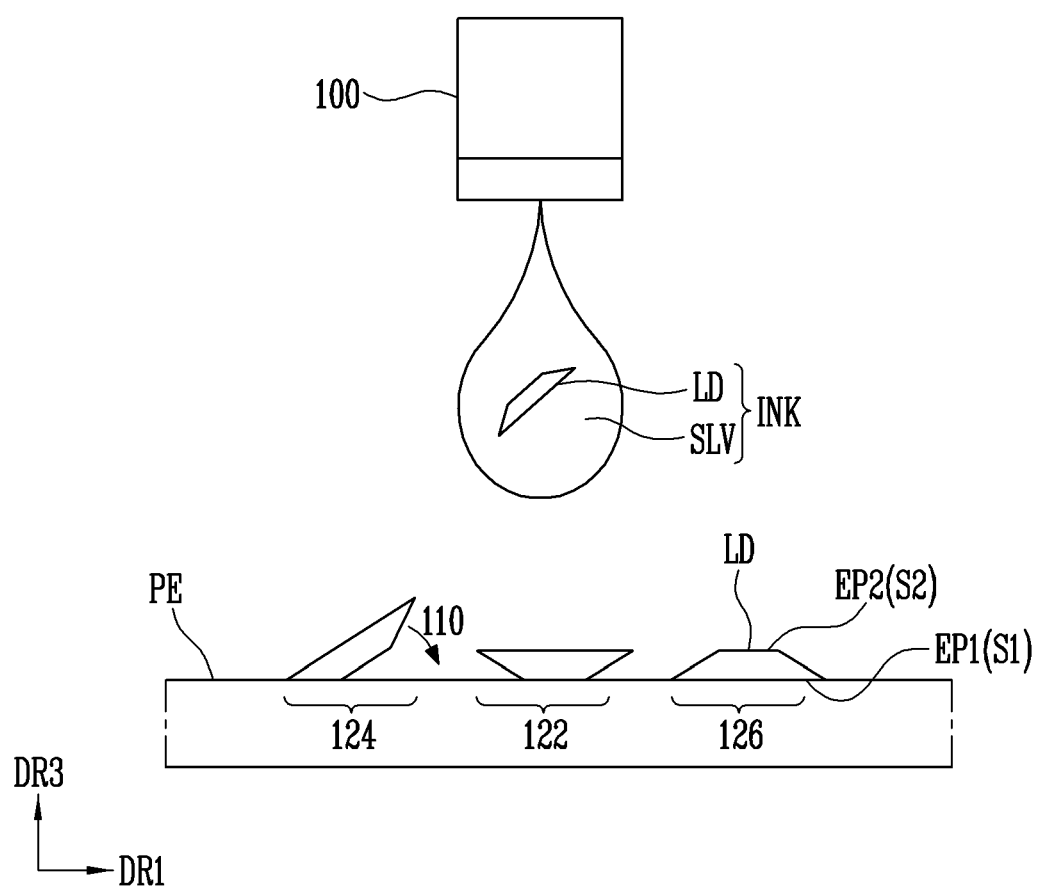
FIG. 17 is a view schematically illustrating a state where light emitting elements according to the example are disposed on an electrode configuration.

With reference to FIG. 17, effects that may be generated by the structural characteristics of a light emitting element LD according to an example will be described. FIG. 17 is a view schematically illustrating a state where light emitting elements according to an example may be disposed on an electrode configuration. In FIG. 17, a state where the ink INK may be provided by a printing apparatus 100 and the light emitting elements LD may be disposed on the electrode configuration is illustrated.

Referring to FIG. 17, the printing apparatus 100 may provide ink INK on the pixel electrode PE, and thereby the light emitting element LD may be positioned on the pixel electrode PE. The printing apparatus 100 may include a nozzle portion capable of discharging a liquid fluid to the outside. The ink INK may include the light emitting element LD and the solvent SLV. The ink INK as defined herein may mean a liquid mixture that may be provided by the printing apparatus 100.

The solvent SLV may be a material other than a solid phase that allows the light emitting element LD to be dispersed and prepared. According to an example, the solvent SLV may be a liquid material having certain physical properties. According to an example, the viscosity of the solvent SLV may be about 10 cP or more. The solvent SLV may include at least one of an alkyl-based solvent containing an alkyl group, an ether-based solvent containing an ether group, an ester-based solvent containing an ester group, an amine-based solvent containing an amine group, an amide-based solvent containing an amide group, an alcohol-based solvent containing an alcohol group, a urethane-based solvent containing a urethane group, a urea-based solvent containing a urea group, an imide-based solvent containing an imide group, an acrylic solvent containing an acrylic group, and a thiol-based solvent containing a thiol group. In case that the ink INK is provided on the pixel electrode PE, the light emitting elements LD may be provided in a form dispersed in the ink INK and may be disposed on the pixel electrode PE.

The pixel electrode PE and the connection electrode CE may have different polarities. Accordingly, in case that different voltage signals are applied to each of the pixel electrode PE and the connection electrode CE, an electric flow may be generated in a direction, and the light emitting element LD may emit light based on the generated electric flow.

When the pixel electrode PE is the anode electrode, the anode of the light emitting element LD may be disposed to face the pixel electrode PE. In case that the pixel electrode PE is the anode electrode, in a case where the cathode of the light emitting element LD may be disposed to face the pixel electrode PE, light may not be emitted even in a case where the electric signal may be applied to the light emitting element LD.

Hereinafter, description will be made in which the pixel electrode PE may be the anode electrode. In order for the light emitting element LD to normally operate, description will be made based on an example in which the second end EP2 of the light emitting element LD has a positive charge and the second surface S2 may be connected to the pixel electrode PE, and the first end EP1 of the light emitting element LD has a negative charge and the first surface S1 may not be connected to the pixel electrode PE, but may be connected to the connection electrode CE.

Referring to FIG. 17, in case disposed on the pixel electrode PE, the light emitting element LD may be disposed in three schematic shapes. For example, the light emitting element LD in the ink INK provided by the printing apparatus 100 may be positioned on the pixel electrode PE, and thus a first disposition state 122, a second disposition state 124, or a third disposition state 126 may be provided.

The first disposition state 122 may mean a normal disposition. The light emitting element LD in the first disposition state 122 may emit light in case that the electrical signal is provided. In the first disposition state 122, the second surface S2 of the light emitting element LD having the positive charge may be connected to the pixel electrode PE.

The second disposition state 124 may mean an abnormal disposition. The light emitting element LD in the second disposition state 124 may not emit light even in case that the electrical signal may be provided.

The third disposition state 126 may mean an abnormal disposition. The light emitting elements LD in the third disposition state 126 may not emit light even in case that an electrical signal may be provided. In the third disposition state 126, the first surface S1 of the light emitting element LD having the negative charge may be physically in contact with the pixel electrode PE. The pixel electrode PE may be the anode electrode, and the light emitting element LD in the third disposition state 126 may not perform a normal operation even in case that an electrical signal may be provided.

For example, in case that the process of disposing the light emitting element LD is performed by outputting the ink INK, there may be a need to decrease a ratio of the light emitting element LD having the second disposition state 124 and the third disposition state 126.

In the light emitting element LD according to the example, a ratio of the first disposition state 122 to those of the second disposition state 124 and the third disposition state 126 may be increased.

A pose of the light emitting element LD provided in the second disposition state 124 may be changed to the first disposition state 122 by a geometric structure of the light emitting element LD.

For example, the height H of the light emitting element LD may be at least smaller than a length defined based on the length of the first surface S1 of the light emitting element, so that even in case that the light emitting element LD is disposed in the second disposition state 124, the light emitting element LD may be rotated in a direction 110 by gravity, so that the light emitting elements LD may be disposed in the first disposition state 122.

In particular, even in case that the angle of the first surface S1 and the side surface of the light emitting element LD is designed to be an angle or less, and the light emitting element LD may be disposed in the second disposition state 124, the light emitting element LD may be rotated by gravity to be disposed more easily in the first disposition state 122.

On the other hand, the ratio of the light emitting element LD provided in the third disposition state 126 may be less than the ratio of the light emitting element LD in the first and second disposition states 122 and 124. Specifically, a probability that the light emitting elements LD may be disposed in the third disposition state 126 may be defined as a first ratio which may be a ratio of the area of the first surface S1 of the light emitting element LD to the total external surface area of the light emitting element LD. In comparison, a probability that the light emitting elements LD may be disposed in the first and second disposition states 122 and 124 may be defined as a second ratio which may be a ratio of all areas except the area of the first surface S1 of the light emitting element LD to the total external surface area of the light emitting element LD. In the light emitting element LD according to the example, the first ratio may be less than the second ratio, and as a result, the ratio of the light emitting elements LD disposed in the third disposition state 126 may be decreased.

As a result, the ratio of the normal operation among the light emitting elements LD provided by the process related to the ink INK may be improved, so that the process yield may be increased, thereby reducing process costs and increasing the light emitting efficiency. According to the geometric shape of the light emitting element LD according to the example, it may be easy to manufacture the light emitting element LD in a small volume, so that dispersion thereof in the ink INK may be easy, which in turn may improve the efficiency of the process related to the ink INK. Furthermore, depending on the examples, an electrode structure for inducing the electrical signal in the vertical direction may be implemented, and thus, misalignment of the light emitting element LD may be prevented.

The above description is merely illustrative of technical ideas of the disclosure, and those of ordinary skill in the art to which the disclosure pertains will be able to make various modifications and variations without departing from the basic characteristics of the disclosure. Accordingly, the examples of the disclosure described above may be implemented separately or in combination with each other.

Accordingly, the examples disclosed in the disclosure are not intended to limit the technical idea of the disclosure, but to explain the technical ideas, and the scope of the technical ideas of the disclosure are not limited by these examples. The scope of protection of the disclosure should be interpreted by the following claims including equivalents thereof, and all technical ideas within the scope thereof should be construed as being included in the scope of the disclosure.

What is claimed is:

1. A light emitting element comprising:
   a first surface corresponding to an end of the light emitting element;
   a second surface corresponding to another end of the light emitting element;
   a first semiconductor layer adjacent to the first surface, the first semiconductor layer including a first type of semiconductor;
   a second semiconductor layer adjacent to the second surface, the second semiconductor layer including a second type of semiconductor different from the first type of semiconductor;
   a transparent electrode between the second semiconductor layer and the second surface;
   an active layer disposed between the first semiconductor layer and the second semiconductor layer; and
   an insulating film that overlaps the first semiconductor layer, the active layer, the second semiconductor layer, and the transparent electrode so that sides of the first semiconductor layer, the active layer, and the second semiconductor layer, and the transparent electrode are prevented from being exposed to the outside, wherein
   a thickness of the insulating film is from about 10 nm to about 200 nm,
   an area of the first surface is larger than an area of the second surface,
   a distance between the first surface and the second surface is shorter than a length defined by the first surface,
   the first surface and the second surface each have an n-polygonal shape (n is an integer of 3 or more), and
   the length defined by the first surface is defined by the following equation;
   $L = \sqrt{x \times y}$, where L is the length defined by the first surface, x is a diameter of an inscribed circle with respect to the first surface, and y is a diameter of a circumscribed circle with respect to the first surface.

2. The light emitting element of claim 1, wherein the light emitting element has a prismoid shape.

3. The light emitting element of claim 1, wherein the distance between the first surface and the second surface is about 0.9 times or less than the diameter of the first surface.

4. The light emitting element of claim 1, wherein
   the length defined by the first surface is a length of a longest side of the first surface.

5. The light emitting element of claim 1, wherein a volume of the light emitting element is about 3 $\mu m^3$ or less.

6. The light emitting element of claim 1, wherein
   a generating line and the first surface of the light emitting element have an angle, and
   the angle is less than about 60 degrees.

7. The light emitting element of claim 4, wherein
   one of surfaces disposed on a side surface and the first surface of the light emitting element have an angle, and
   the angle is less than about 60 degrees.

8. A method of manufacturing a light emitting element, comprising:
   preparing a stacked substrate;
   forming a sacrificial layer on the stacked substrate;
   forming a first semiconductor layer including a first type of semiconductor on the sacrificial layer;
   forming an active layer on the first semiconductor layer;
   forming a second semiconductor layer including a second type of semiconductor on the active layer;
   performing an etching process in a direction from the second semiconductor layer toward the first semiconductor layer to remove at least a part of each of the first semiconductor layer, the active layer, and the second semiconductor layer; and
   separating at least a portion of the first semiconductor layer from the sacrificial layer,
   wherein
   the etching process is performed such that an area of an etched region decreases as an etching depth increases,
   the light emitting element has an n-polygonal shape (n is an integer of 3 or more) in which a surface has a first area, and another surface has an n-polygonal shape having a second area larger than the first area, and a distance between the surface and the another surface satisfies the following equation:

h≤√x×y, where h is the distance, x is a diameter of an inscribed circle with respect to the another surface, and y is a diameter of a circumscribed circle with respect to the another surface.

9. The method of claim 8, wherein in the performing of the etching process, a light emitting stacked pattern is formed in which the first semiconductor layer, the active layer, and the second semiconductor layer are sequentially stacked on each other.

10. The method of claim 9, further comprising:
separating the light emitting stacked pattern from the stacked substrate and the sacrificial layer,
wherein after the separating of the light emitting stacked pattern, the light emitting element is formed to have a shape of a prismoid.

11. The method of claim 8, wherein the etching process includes at least one of reactive ion etching (RIE), reactive ion beam etching (RIBE), and inductively coupled plasma reactive ion etching (ICP-RIE).

12. A display device comprising:
a substrate;
a light emitting element including:
  a first surface corresponding to an end of the light emitting element;
  a second surface corresponding to another end of the light emitting element;
  a first semiconductor layer adjacent to the first surface, the first semiconductor layer including a first type of semiconductor;
  a second semiconductor layer adjacent to the second surface, the second semiconductor layer including a second type of semiconductor different from the first type of semiconductor;
  a transparent electrode between the second semiconductor layer and the second surface; and
  an active layer disposed between the first semiconductor layer and the second semiconductor layer;
a first electrode disposed on the substrate and electrically connected to the light emitting element through the second surface;
a second electrode disposed on the substrate and electrically connected to the light emitting element through the first surface; and
an insulating film that overlaps the first semiconductor layer, the active layer, the second semiconductor layer, and the transparent electrode so that sides of the first semiconductor layer, the active layer, and the second semiconductor layer, and the transparent electrode are prevented from being exposed to the outside, wherein a thickness of the insulating film is from about 10 nm to about 200 nm, an area of the first surface is larger than an area of the second surface, a distance between the first surface and the second surface is shorter than a length defined by the first surface, the first electrode is disposed between the substrate and the second electrode, the first surface physically contacts at least a part of the second electrode, the second surface includes the area smaller than the area of the first surface and physically contacts at least a part of the first electrode, the first surface and the second surface each have an n-polygonal shape (n is an integer of 3 or more), and the length defined by the first surface is defined by the following equation:

L=√x×y, where L is the length defined by the first surface, x is a diameter of an inscribed circle with respect to the first surface, and y is a diameter of a circumscribed circle with respect to the first surface.

13. The display device of claim 12, wherein an area in which the first electrode and the second surface physically contact with each other is smaller than an area in which the second electrode and the first surface physically contact with each other.

14. The display device of claim 12, wherein
an electrical signal flows between the first electrode and the second electrode in a first direction, and
the first direction is perpendicular to a main surface of the substrate.

15. The display device of claim 12, wherein
a polarity of the first electrode corresponds to a polarity of the first type of semiconductor, and
a polarity of the second electrode corresponds to a polarity of the second type of semiconductor.

16. The light emitting element of claim 1, wherein the transparent electrode is in direct contact with the insulating film and the second semiconductor layer.

* * * * *